(12) United States Patent
Miho (10) Patent No.: US 7,535,388 B2
(45) Date of Patent: May 19, 2009

(54) CALCULATION OF ADC AND DAC ERRORS IN LSI CHIP

(75) Inventor: Akira Miho, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/892,356

(22) Filed: Aug. 22, 2007

(65) Prior Publication Data

US 2008/0079620 A1    Apr. 3, 2008

(30) Foreign Application Priority Data

Sep. 29, 2006   (JP)   ............................. 2006-269639

(51) Int. Cl.
*H03M 1/06*    (2006.01)
(52) U.S. Cl. ..................... 341/118; 341/120; 341/155
(58) Field of Classification Search ................ 341/155, 341/144, 118, 120, 110
See application file for complete search history.

(56) References Cited

U.S. PATENT DOCUMENTS 4,829,236 A * 5/1989 Brenardi et al. ............... 324/74
6,081,215 A * 6/2000 Kost et al. ................... 341/120
6,489,912 B2 * 12/2002 Lamb et al. .................. 341/155

FOREIGN PATENT DOCUMENTS

JP         52-93361         8/1977

* cited by examiner

*Primary Examiner*—Brian Young
(74) *Attorney, Agent, or Firm*—Fujitsu Patent Center

(57) ABSTRACT

A semiconductor integrated circuit includes a bus, a CPU connected to the bus, a DAC having a digital input thereof connected to the bus, an ADC having a digital output thereof connected to the bus, a voltage generating circuit, a first switch configured to cause an electrical coupling between an analog input of the ADC and the voltage generating circuit to switch between a conductive state and a nonconductive state, and a second switch configured to cause an electrical coupling between an analog output of the DAC and the analog input of the ADC to switch between a conductive state and a nonconductive state.

9 Claims, 6 Drawing Sheets

CALCULATION OF ADC AND DAC ERRORS IN LSI CHIP

CROSS-REFERENCE TO RELATED APPLICATIONS

The present application is based upon and claims the benefit of priority from the prior Japanese Patent Application No. 2006-269639 filed on Sep. 29, 2006, with the Japanese Patent Office, the entire contents of which are incorporated herein by reference.

BACKGROUND OF THE INVENTION

1. Field of the Invention

The present invention generally relates to semiconductor integrated circuits, and particularly relates to a semiconductor integrated circuit having an ADC and a DAC.

2. Description of the Related Art

Figure 1:
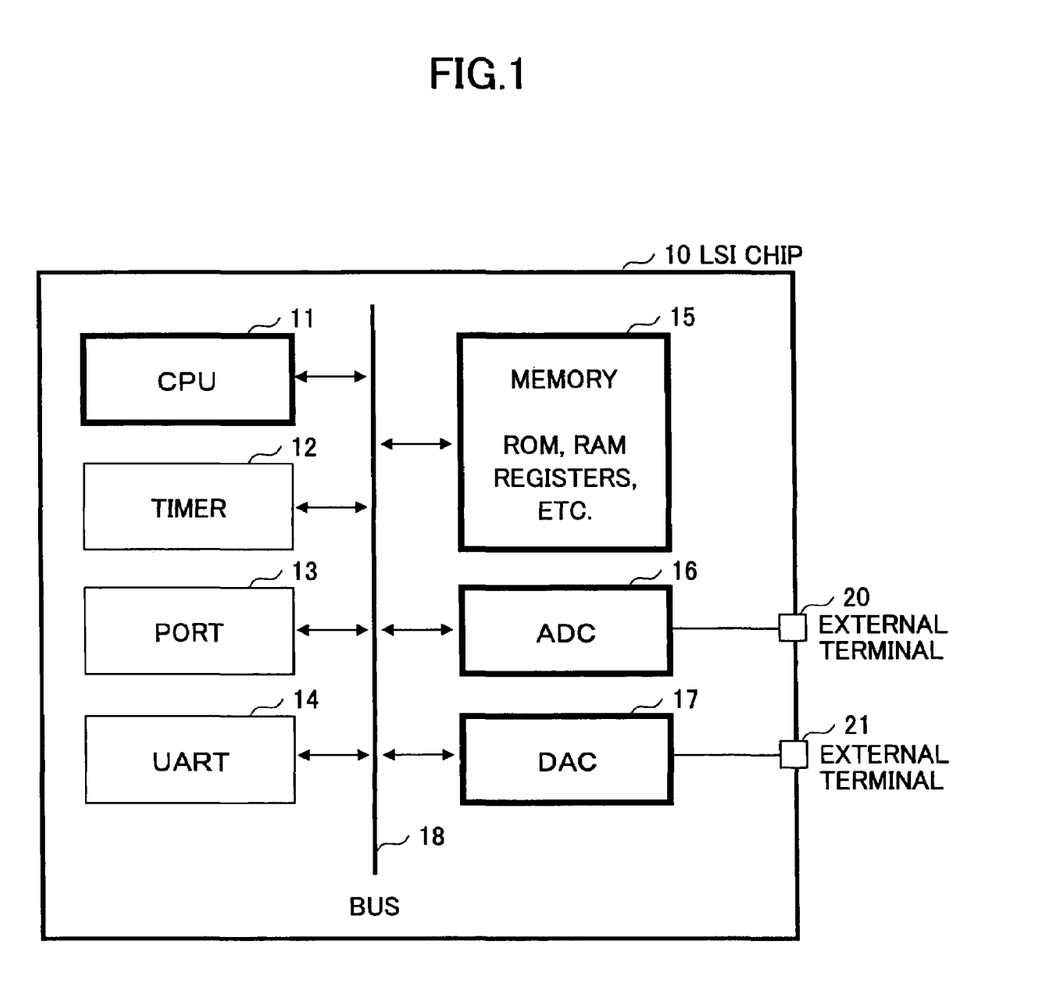
FIG. 1 is a drawing showing the configuration of a related-art LSI chip having an ADC and DAC implemented thereon.

There is a general-purpose chip having both an ADC (analog-to-digital converter) and a DAC (digital-to-analog converter) implemented on a single semiconductor integrated circuit chip together with a CPU, a memory, and the like. FIG. 1 is a drawing showing an example of a general configuration of such a chip.

In FIG. 1, an LSI chip 10 having an ADC and DAC mounted thereon includes a CPU 11, a timer 12, a port 13, a UART 14, a memory 15, an ADC 16, a DAC 17, and a bus 18. The CPU 11, the timer 12, the port 13, the UART 14, the memory 15, the ADC 16, and the DAC 17 are connected to each other via the bus 18.

The ADC 16 has an analog input thereof coupled to an external terminal 20. The DAC 17 has an analog output thereof coupled to an external terminal 21. The ADC 16 performs an AD conversion with respect to an analog voltage supplied via the external terminal 20, and outputs to the bus 18 a digital code obtained as the digital output of the AD conversion. The digital code is stored in the memory 15. The DAC 17 performs a DA conversion with respect to a digital input, which is a digital code supplied via the bus 18 from the CPU 11, for example, and outputs, to the outside via the external terminal 21, an analog voltage obtained as the analog output of the DA conversion.

The ADC and DAC generally involve conversion error. In consideration of this, it is preferable that conversion errors are measured in advance with respect to the ADC and DAC, respectively, and that a correction process is performed based on the measured errors at the time of performing an actual AD conversion and an actual DA conversion. In the LSI chip 10 as shown in FIG. 1, conventionally, a predetermined analog voltage is input via the external terminal 20 to subsequently check a digital code after the AD conversion, and an analog voltage after the DA conversion of a predetermined digital code is output and measured via the external terminal 21 for the purpose of obtaining the errors of the ADC 16 and DAC 17 of the LSI chip 10.

In such a case, there are needs to input analog voltages for a large number of sample points and to measure output analog voltages for a large number of sample points. This gives rise to a problem in that significant time and labor are required.

[Patent Document 1] Japanese Patent Application Publication No. 52-093361

Accordingly, there is a need for a semiconductor integrated circuit chip with an ADC and DAC mounted thereon that is capable of efficiently measuring and correcting errors of the ADC and DAC, and there is also a need for a program and method for error calculation and correction.

SUMMARY OF THE INVENTION

It is a general object of the present invention to provide a semiconductor integrated circuit and error calculation method that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor integrated circuit and error calculation method particularly pointed out in the specification in such full, clear, concise, and exact terms as to enable a person having ordinary skill in the art to practice the invention.

To achieve these and other advantages in accordance with the purpose of the invention, the invention provides a semiconductor integrated circuit which includes a bus, a CPU connected to the bus, a DAC having a digital input thereof connected to the bus, an ADC having a digital output thereof connected to the bus, a voltage generating circuit, a first switch configured to cause an electrical coupling between an analog input of the ADC and the voltage generating circuit to switch between a conductive state and a nonconductive state, and a second switch configured to cause an electrical coupling between an analog output of the DAC and the analog input of the ADC to switch between a conductive state and a nonconductive state.

According to another aspect of the present invention, a machine-readable medium having a program embodied therein is provided for use in a semiconductor integrated circuit including a bus, a CPU connected to the bus, a DAC having a digital input thereof connected to the bus, an ADC having a digital output thereof connected to the bus, a voltage generating circuit, a first switch configured to cause an electrical coupling between an analog input of the ADC and the voltage generating circuit to switch between a conductive state and a nonconductive state, and a second switch configured to cause an electrical coupling between an analog output of the DAC and the analog input of the ADC to switch between a conductive state and a nonconductive state. The program when executed by the CPU performs the steps of causing the voltage generating circuit to output a first analog voltage, making the first switch conductive to cause the ADC to convert the first analog voltage into a first digital value, storing the first digital value in the memory, causing the DAC to output a second analog voltage in response to a digital input that is a digital code supplied via the bus, making the second switch conductive to cause the ADC to convert the second analog voltage into a second digital value, storing the second digital value in the memory, calculating error of the ADC based on the first digital value, and calculating error of the DAC based on the second digital value and the calculated error of the ADC.

According to another aspect of the present invention, a method of calculating error is provided for use for a semiconductor integrated circuit including a bus, a CPU connected to the bus, a DAC having a digital input thereof connected to the bus, an ADC having a digital output thereof connected to the bus, a voltage generating circuit, a first switch configured to cause an electrical coupling between an analog input of the ADC and the voltage generating circuit to switch between a conductive state and a nonconductive state, and a second switch configured to cause an electrical coupling between an analog output of the DAC and the analog input of the ADC to switch between a conductive state and a nonconductive state. The method includes the steps of causing the voltage generating circuit to output a first analog voltage, making the first switch conductive to cause the ADC to convert the first analog voltage into a first digital value, storing the first digital value in the memory, causing the DAC to output a second analog voltage in response to. a digital input that is a digital code supplied via the bus, making the second switch conductive to cause the ADC to convert the second analog voltage into a second digital value, storing the second digital value in the memory, calculating error of the ADC based on the first digital value, and calculating error of the DAC based on the second digital value and the calculated error of the ADC.

According to at least one embodiment of the present invention, the provision of the voltage generating circuit, the first switch, and the second switch makes it possible to measure and calculate ADC and DAC errors inside the LSI chip. For example, a program stored in memory may be performed by the CPU so as to cause the voltage generating circuit, the first switch, and the second switch to operate under the control of the CPU, thereby automatically measuring and calculating ADC and DAC errors. This makes it possible to measure and correct ADC and DAC errors efficiently.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 2:
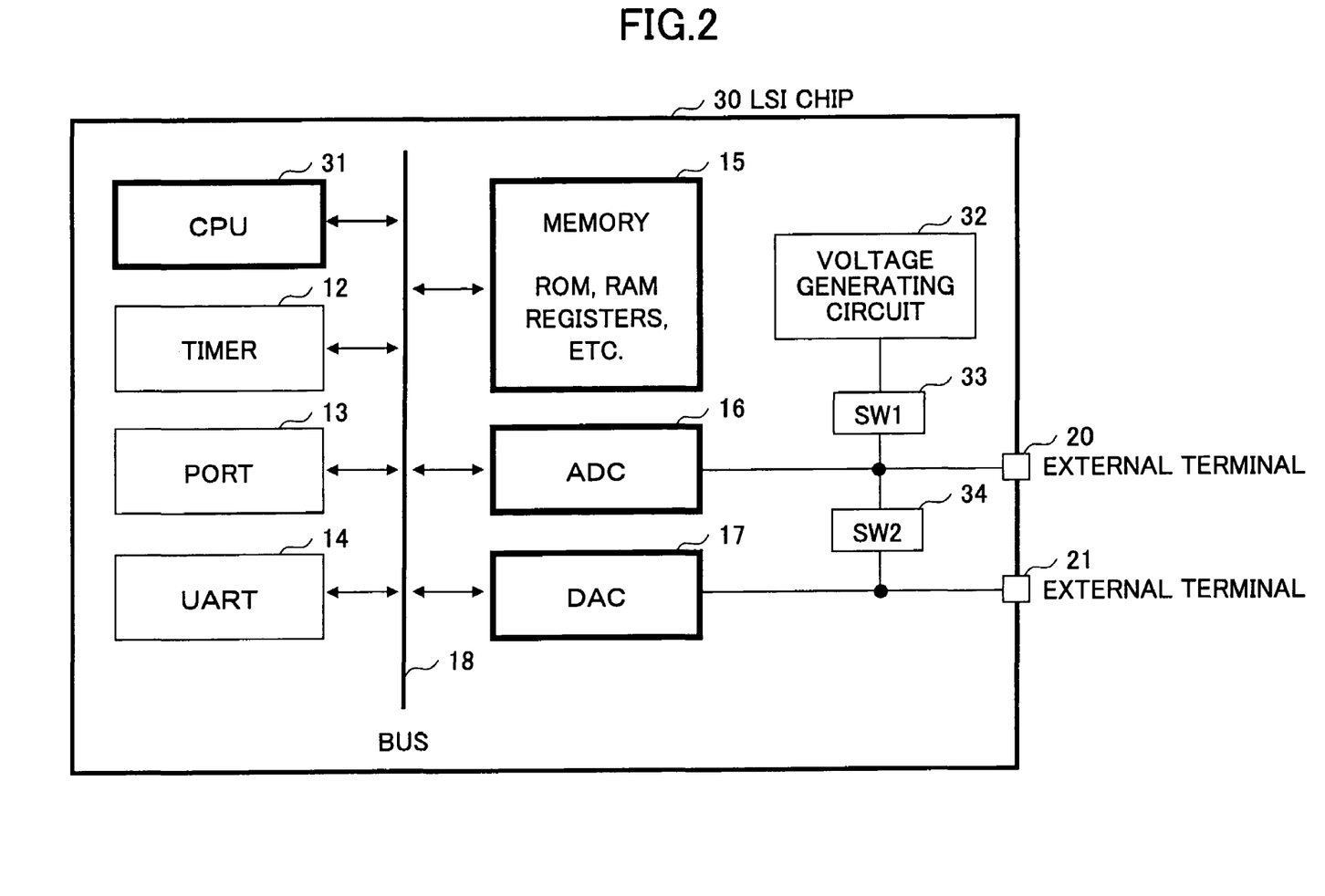
FIG. 2 is a drawing showing an example of the configuration of a semiconductor integrated circuit chip according to the present invention.

FIG. 2 is a drawing showing an example of the configuration of a semiconductor integrated circuit chip according to the present invention. In FIG. 2, the same elements as those of FIG. 1 are referred to by the same numerals, and a description thereof will be omitted.

In FIG. 2, an LSI chip (semiconductor integrated circuit chip) 30 having an ADC and DAC mounted thereon includes a CPU 31, a timer 12, a port 13, a UART 14, a memory 15, an ADC 16, a DAC 17, a bus 18, a voltage generating circuit 32, a first switch (SW1) 33, and a second switch (SW2) 34. The CPU 31, the timer 12, the port 13, the UART 14, the memory 15, the ADC 16, and the DAC 17, are connected to each other via the bus 18. The LSI chip 30 is a single chip, so that all the constituent elements shown in FIG. 2 are provided on this single chip.

The ADC 16 has an analog input thereof coupled to an external terminal 20. The DAC 17 has an analog output thereof coupled to an external terminal 21. The ADC 16 performs an AD conversion with respect to an analog voltage supplied via the external terminal 20, and outputs to the bus 18 a digital code obtained as the digital output of the AD conversion. The digital code is stored in the memory 15. The DAC 17 performs a DA conversion with respect to a digital input, which is a digital code supplied via the bus 18 from the CPU 31, for example, and outputs, to the outside via the external terminal 21, an analog voltage obtained as the analog output of the DA conversion.

The ADC and DAC generally involve conversion error. In consideration of this, it is preferable that conversion errors are measured in advance with respect to the ADC and DAC, respectively, and that a correction process is performed based on the measured errors at the time of performing an actual AD conversion and an actual DA conversion.

In the present invention, the provision of the voltage generating circuit 32, the first switch 33, and the second switch 34 makes it possible to measure and calculate ADC and DAC errors inside the LSI chip 30. Further, provision is made such that a program (automatic error calculation and correction program) stored in the memory 15 is performed by the CPU 31 so as to cause the voltage generating circuit 32, the first switch 33, and the second switch 34 to operate under the control of the CPU 31, thereby automatically measuring and calculating ADC and DAC errors. This makes it possible to measure and correct ADC and DAC errors efficiently. In FIG. 2, the memory 15 includes a ROM for storing fixed control information and programs, a RAM for use as a data storage area and a work area, and registers used for various purposes.

The first switch 33 is disposed to couple between the voltage generating circuit 32 and the analog input of the ADC 16, and serves to cause an electrical coupling between the voltage generating circuit 32 and the analog input of the ADC 16 to switch between the conductive state and the nonconductive state. The second switch 34 is disposed to couple between the analog output of the DAC 17 and the analog input of the ADC 16, and serves to cause an electrical coupling between the analog output of the DAC 17 and the analog input of the ADC 16 to switch between the conductive state and the nonconductive state. Provision is made such that the CPU 31 can control the voltage generating operation of the voltage generating circuit 32 and the switching operations of the first switch 33 and the second switch 34. Namely, a module for controlling the voltage generating circuit 32, the first switch 33, and the second switch 34 may be connected to the bus 18, such that the CPU 31 can send control commands to the module to perform desired control. Alternatively, direct control lines may be provided between the CPU 31 and each of the voltage generating circuit 32, the first switch 33, and the second switch 34, such that the CPU 31 can perform desired control through these control lines. In FIG. 2, these control channels are not shown for the sake of simplicity of illustration.

According to the present invention, in the LSI chip 30 shown in FIG. 2, the voltage generating circuit 32 is made to generate a first analog voltage, and the first switch 33 is made conductive to cause the ADC 16 to convert the first analog voltage into a first digital value, which is then stored in the memory 15. Further, the DAC 17 is made to generate a second analog voltage in response to a digital input that is a digital code supplied via the bus 18, and the second switch 34 is made conductive to cause the ADC 16 to convert the second analog voltage into a second digital value, which is then stored in the memory 15. Further, the error of the ADC 16 is calculated based on the first digital value, and the error of the DAC 17 is calculated based on the second digital value and the calculated error of the ADC 16. These operations may be implemented by causing the CPU 31 to execute the program (automatic error calculation and correction program) stored in the memory 15 so as to cause the voltage generating circuit 32, the first switch 33, the second switch 34, the ADC 16, and the DAC 17 to operate under the control of the CPU 31.

Figure 3:
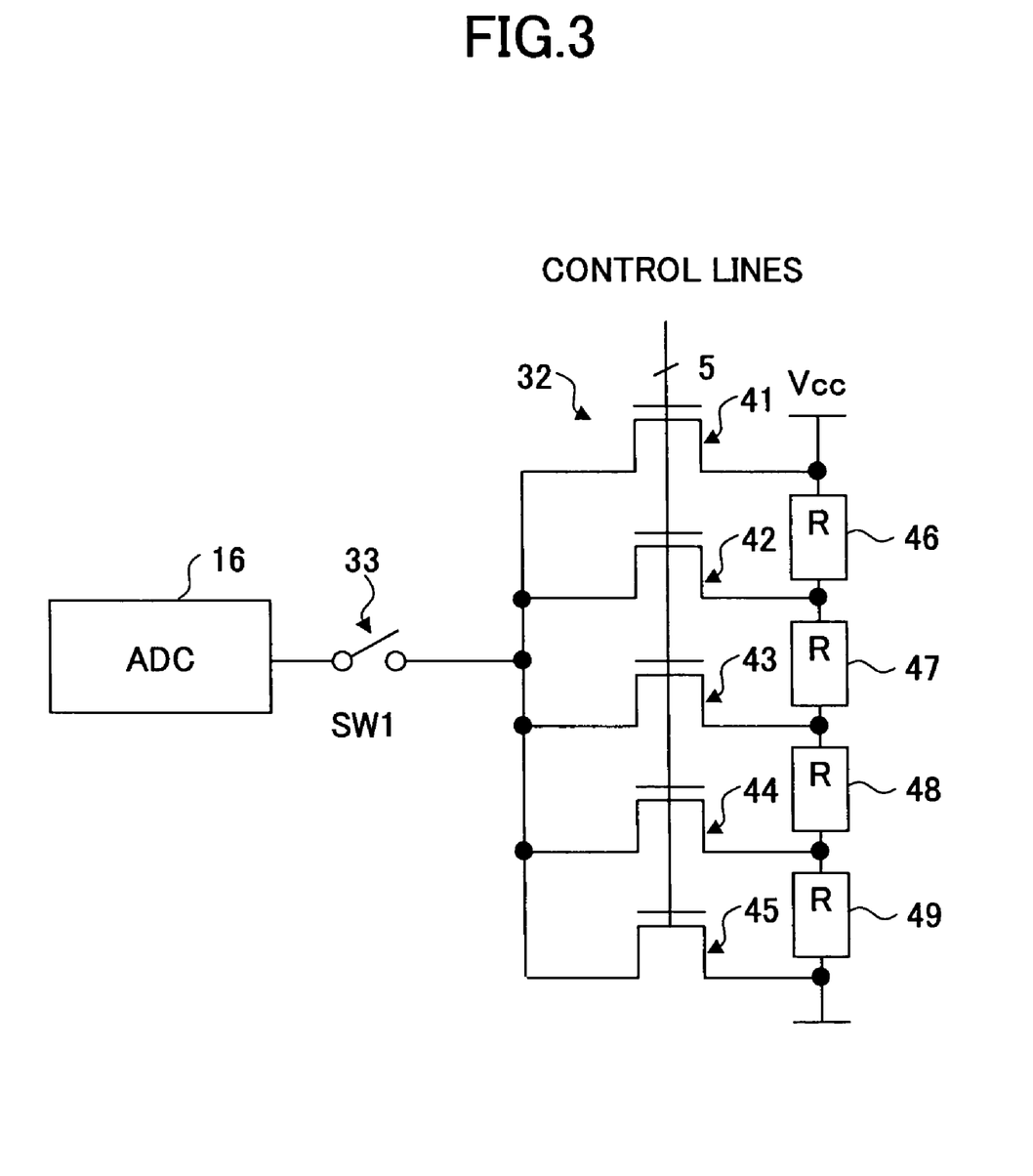
FIG. 3 is a drawing showing an example of the configuration of a voltage generating circuit.

FIG. 3 is a drawing showing an example of the configuration of the voltage generating circuit 32. The voltage generating circuit 32 shown in FIG. 3 includes a plurality of transistors 41 through 45 and a plurality of resistor elements 46 through 49 connected in series. One end of the resistor element line comprised of the resistor elements 46 through 49 is coupled to a power supply potential Vcc, and the other end thereof is coupled to a ground potential. This resistor element line can produce 5 different voltages such as 0 V, 1/4 Vcc, 2/4 Vcc, 3/4 Vcc, and 4/4/Vcc. The number of potential division is four in this example, but may be set to any number according to need.

The gates of the transistors 41 through 45 are connected to respective control lines that are independent of each other. When one of the control lines becomes HIGH, the corresponding one of the transistors becomes conductive. Each of the transistors 41 through 45 has one end of its channel coupled to a corresponding point on the resistor element line comprised of the resistor elements 46 through 49, and has the other end of its channel coupled to the analog input of the ADC 16 via the first switch 33. When one of the transistors becomes conductive, the corresponding voltage is supplied to the ADC 16 via this transistor and the first switch 33.

Figure 4:
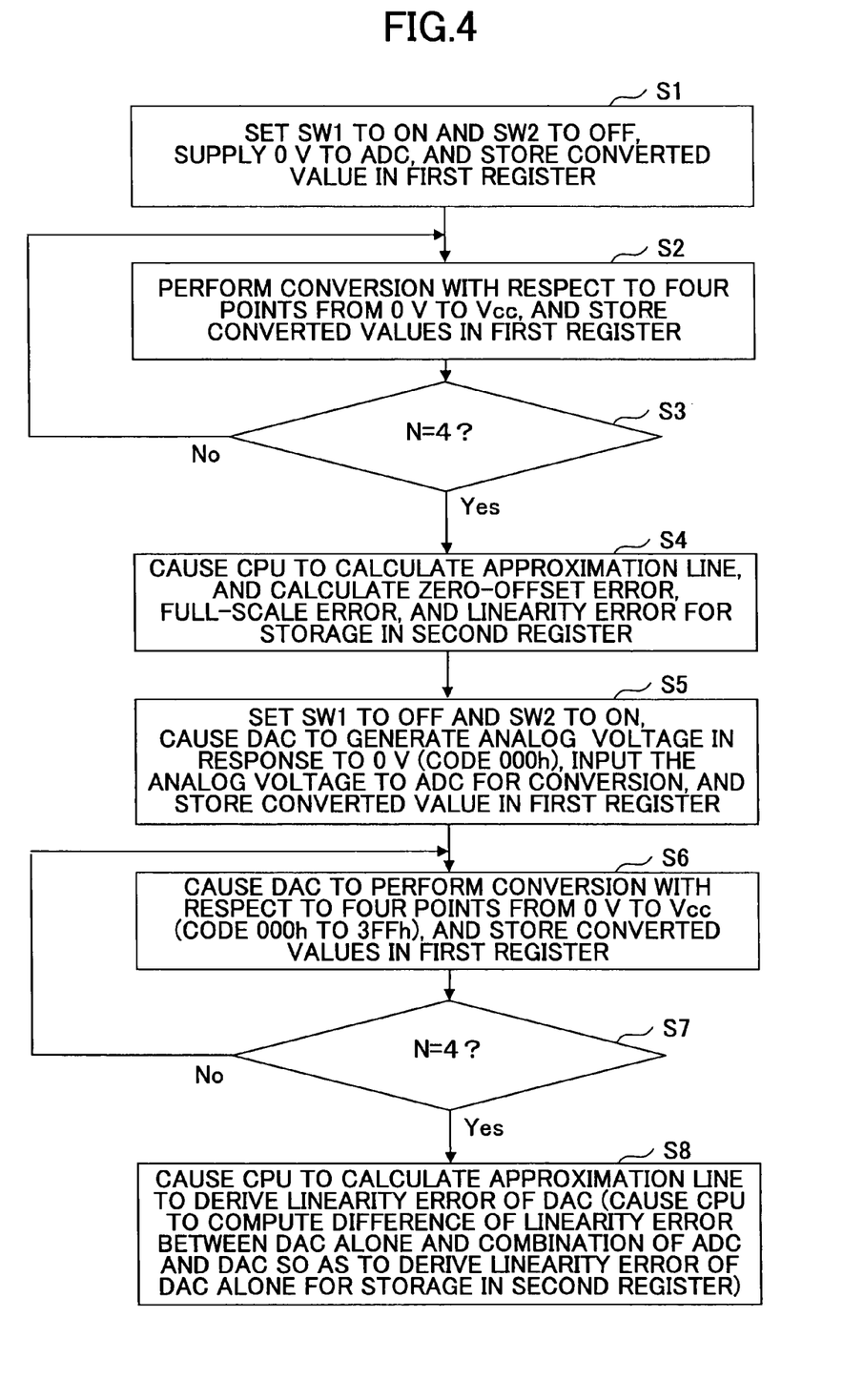
FIG. 4 is a flowchart showing an example of the method of measuring and calculating ADC and DAC errors in the LSI chip.

FIG. 4 is a flowchart showing an example of the method of measuring and calculating ADC and DAC errors in the LSI chip 30.

At step S1, the first switch 33 is set to ON (conductive), and the second switch 34 is set to OFF (nonconductive), with the voltage generating circuit 32 generating 0 V, so that the ADC 16 performs an AD conversion with respect to 0 V to produce as a conversion result a digital code, which is then stored in a first register. The first register is part of the memory 15 shown in FIG. 2, and may be a register comprised of dedicated hardware or a portion of the RAM area assigned as a register.

At step S2, the same operation as that performed at step S1 is performed with respect to each one of the four sample voltages 1/4 Vcc through 4/4 Vcc. Specifically, the same operation as that performed at step S1 is performed at step S2 with respect to an analog voltage of (N/4)Vcc (N: natural number), followed by checking whether N is 4 at step S3. Namely, a check is made as to whether the AD conversion is performed for all the four samples (5 samples if 0 V is included). If all the four samples are not yet finished, the procedure goes back to step S2, followed by incrementing N by one to perform the AD conversion with respect to the next voltage. If the check at step S3 finds that N is 4, the procedure proceeds to step S4.

At step S4, a straight line approximating the relationship between the input voltage and output voltage of the ADC 16 is calculated based on the (N+1) digital codes stored in the first register in one-to-one correspondence to the (N+1) samples, followed by calculating a zero-offset error, a full-scale error, and a linearity error (straight-line error) based on this approximation straight line. The zero-offset error, full-scale error, and linearity error (straight-line error) calculated in this manner are then stored in a second register. The calculations described above are performed by the CPU 31 of the LSI chip 30.

Figure 5:
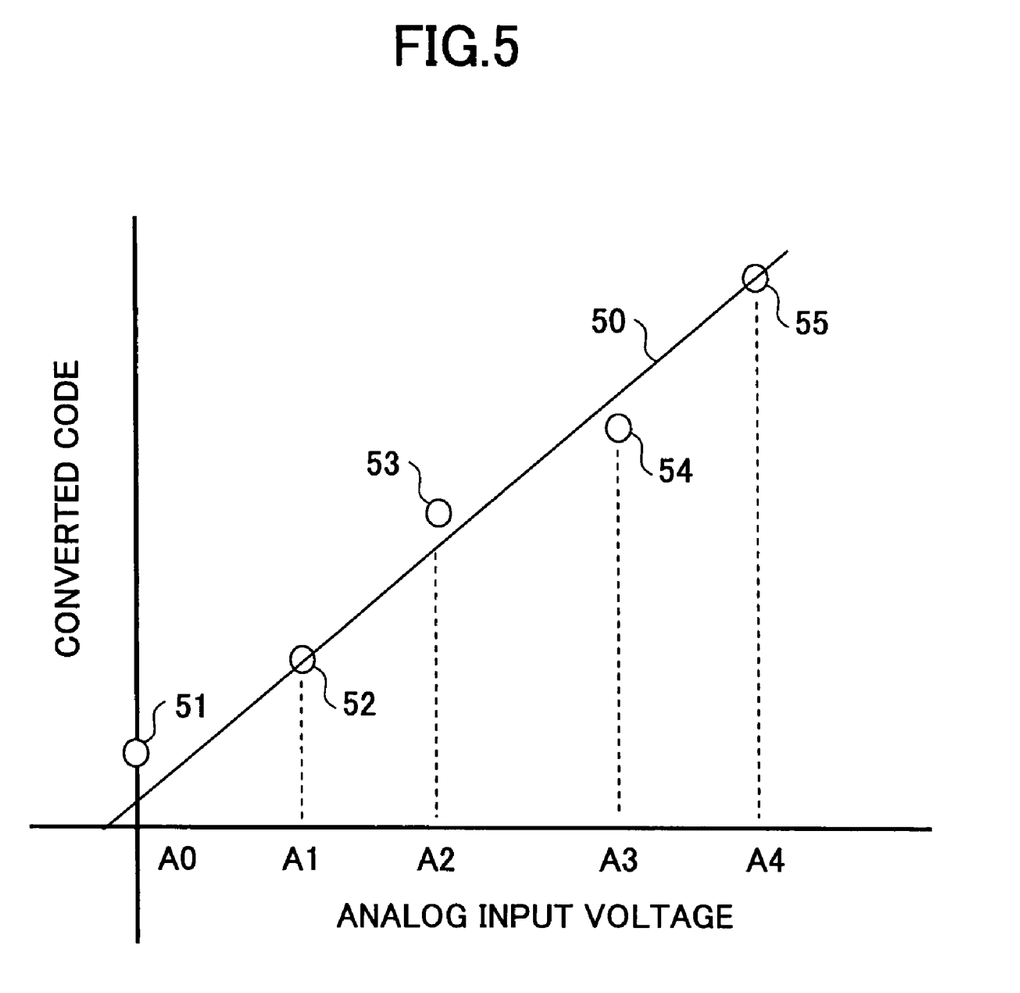
FIG. 5 is a drawing for explaining the approximation straight line.

FIG. 5 is a drawing for explaining the approximation straight line. The horizontal axis of FIG. 5 represents an analog voltage input into the ADC 16, and the vertical axis represents a digital output (converted digital code) that is output from the ADC 16.

As shown in FIG. 5, output digital codes (converted codes) shown as plots 51 through 55 are obtained with respect to input analog voltages A0 through A4 (0 V through 4/4 Vcc), respectively. An approximation straight line 50 is obtained by placing a straight line that achieves the least square error for these plots, for example.

The zero-offset error, full-scale error, and linearity error (straight-line error) are error values that are typically used as evaluation criteria indicating the accuracy of ADC. The zero-offset error is equal to an input voltage that is being input when the output digital code shifts from zero (000h) to a next digital code (001h), and is ideally equal to 0.5 LSB. With respect to the approximation straight line 50, xLSB may be the input voltage that is being input when the output digital code shifts from zero (000h) to the next digital code (001h). In this case, x−0.5 LSB that is a difference between the value x and the ideal value is the zero-offset error. Here, LSB refers to a difference between ideal input voltages corresponding to two consecutive output digital codes, and is an input voltage value corresponding to the resolution of ADC.

The full-scale error is equal to an input voltage that is being input when the output digital code shifts to the maximum value (i.e., full-scale value), and is ideally equal to Vmax−1.5 LSB where Vmax is the maximum input voltage. With respect to the approximation straight line 50, yLSB may be the input voltage that is being input when the output digital code shifts to the maximum value (i.e., full-scale value). In this case, y−(Vmax−1.5 LSB) that is a difference between the value y and the ideal value is the full-scale error.

The linearity error is the maximum value of a difference between the approximation straight line 50 and the straight line indicating the ideal relationship between inputs and outputs. Namely, a difference between an output digital code of the approximation straight line 50 and an output digital code of the ideal straight line is calculated with respect to each analog input voltage, and the maximum of the calculated differences is used as the linearity error.

Referring back to FIG. 4, at step S5, the first switch 33 is set to OFF (nonconductive), and the second switch 34 is set to ON (conductive), with the DAC 17 generating an analog voltage in response to the minimum digital code (000h) used as an input, so that the ADC 16 performs an AD conversion with respect to this analog voltage to produce as a conversion result a digital code, which is then stored in the first register. This analog voltage is ideally 0 V, but includes the error of the ADC 16 in reality.

At step S6, the same operation as that performed at step S5 is performed with respect to four predetermined sample codes, which may range from 000h to 3FFh in the case of 10-bit inputs, for example. Specifically, the same operation as that performed at step S5 is performed at step S6 with respect to a converted digital code equal to Nx100h-001h (N: natural number), for example, followed by checking whether N is 4 at step S7. Namely, a check is made as to whether the DA conversion and AD conversion are performed for all the four samples (5 samples if 000h is included). If all the four samples are not yet finished, the procedure goes back to step S6, followed by incrementing N by one to perform the DA conversion and AD conversion with respect to the next digital code. If the check at step S7 finds that N is 4, the procedure proceeds to step S8.

At step S8, the linearity error of the DAC 17 is computed based on the linearity error of the ADC 16 stored in the second register and the (N+1) digital codes stored in the first register in one-to-one correspondence to the (N+1) samples. First, the predetermined digital codes that were input into the DAC 17 at steps S5 and S6 are used as inputs, and the (N+1) digital codes stored in the first register are used as outputs, thereby calculating an approximation straight line indicating the input/output relationship. If the approximation straight line obtained in this manner is used to derive the linearity error, such linearity error ends up including both the linearity error of the DAC 17 and the linearity error of the ADC 16. In consideration of this, the linearity error of the ADC 16 calculated at step S4 and stored in the second register is referred to, and the linearity error of the ADC 16 is canceled from the linearity error obtained from the above-noted approximation straight line, thereby calculating the linearity error of the DAC 17 alone. This makes it possible to obtain a digital code that should be input into the DAC 17 when a desired analog voltage needs to be generated through DA conversion by the DAC 17. The calculations described above may be performed by the CPU 31 of the LSI chip 30.

Figure 6:
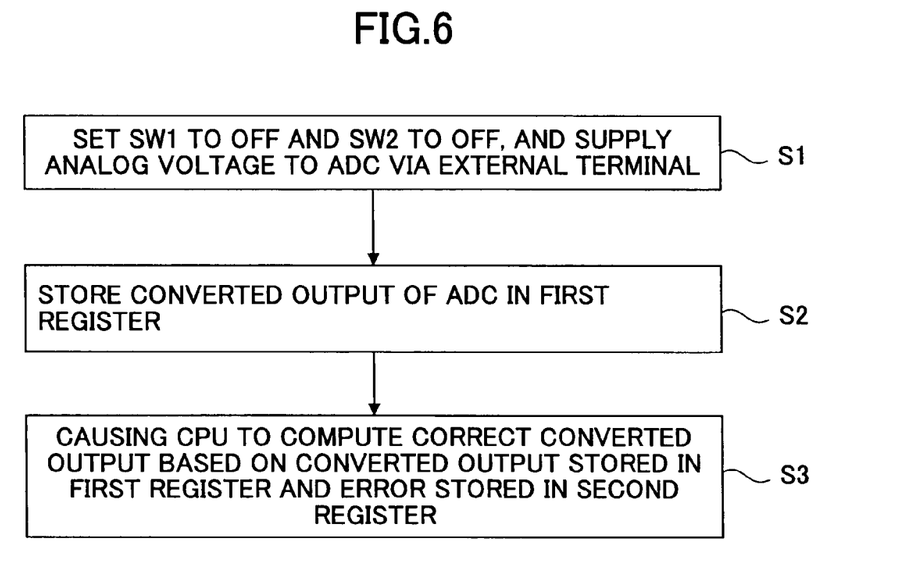
FIG. 6 is a flowchart showing a process of performing an AD conversion with respect to an analog voltage supplied via the external terminal.

FIG. 6 is a flowchart showing a process of performing an AD conversion with respect to an analog voltage supplied via the external terminal 20.

At step S1, the first switch 33 is set to OFF (nonconductive), and the second switch 34 is set to OFF (nonconductive), with an analog voltage being supplied via the external terminal 20 to the ADC 16.

At step S2, the converted digital code obtained through the AD conversion of the input analog voltage by the ADC 16 is stored in the first register.

At step S3, correction using the zero-offset error, full-scale error, and linearity error of the ADC 16 stored in the second register is applied to the digital code stored in the first register, thereby deriving a digital code correctly indicating the input analog voltage. This correction may be automatically performed by the CPU 31 of the LSI chip 30.

Figure 7:
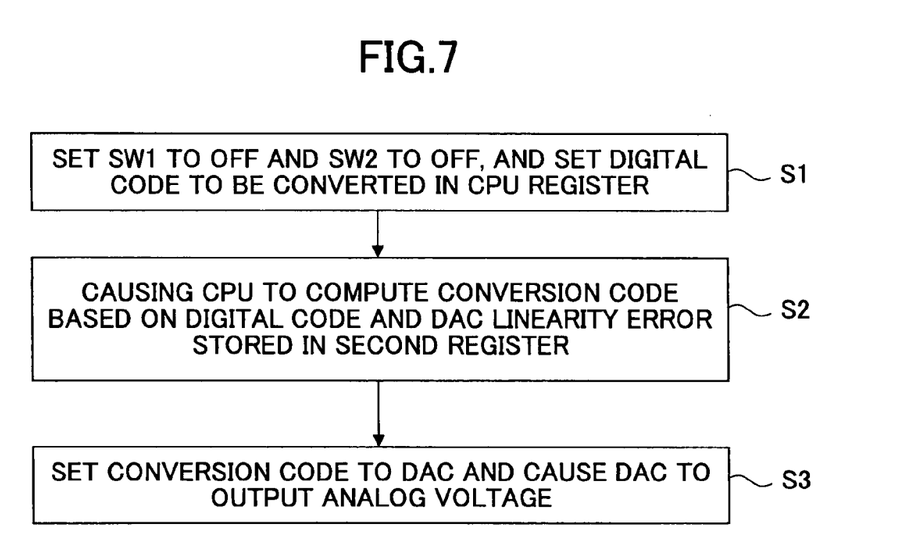
FIG. 7 is a flowchart showing a process performed when the DAC outputs a desired analog voltage to the external terminal.

FIG. 7 is a flowchart showing a process performed when the DAC 17 outputs a desired analog voltage to the external terminal 21.

At step S1, the first switch 33 is set to OFF (nonconductive), and the second switch 34 is set to OFF (nonconductive), with the CPU 31 setting a digital code to be converted in an internal register. The digital code to be converted refers to a digital code corresponding to a desired analog voltage under the assumption that ideal DA conversion characteristics are used.

At step S3, correction using the linearity error of the DAC 17 stored in the second register is applied by the CPU 31 to the digital code to be converted, thereby deriving a digital code that is needed by the DAC 17 to correctly generate the desired analog voltage. This correction may be automatically performed by the CPU 31 of the LSI chip 30.

At step S3, the corrected digital code is supplied from the CPU 31 via the bus 18 to the DAC 17, so that the DAC 17 outputs the desired analog voltage via the external terminal 21.

Further, the present invention is not limited to these embodiments, but various variations and modifications may be made without departing from the scope of the present invention.

What is claimed is:

1. A semiconductor integrated circuit, comprising:
a bus;
a CPU connected to the bus;
a DAC having a digital input thereof connected to the bus;
an ADC having a digital output thereof connected to the bus;
a voltage generating circuit;
a first switch configured to cause an electrical coupling between an analog input of the ADC and the voltage generating circuit to switch between a conductive state and a nonconductive state; and
a second switch configured to cause an electrical coupling between an analog output of the DAC and the analog input of the ADC to switch between a conductive state and a nonconductive state.

2. The semiconductor integrated circuit as claimed in claim 1, wherein the CPU is configured to control operations of the voltage generating circuit, the first switch, and the second switch.

3. The semiconductor integrated circuit as claimed in claim 2, further comprising a memory connected to the bus, wherein the CPU is configured to operate based on a program stored in the memory to control operations of the voltage generating circuit, the first switch, and the second switch.

4. A machine-readable medium having a program embodied therein for use in a semiconductor integrated circuit including a bus, a CPU connected to the bus, a DAC having a digital input thereof connected to the bus, an ADC having a digital output thereof connected to the bus, a voltage generating circuit, a first switch configured to cause an electrical coupling between an analog input of the ADC and the voltage generating circuit to switch between a conductive state and a nonconductive state, and a second switch configured to cause an electrical coupling between an analog output of the DAC and the analog input of the ADC to switch between a conductive state and a nonconductive state, the program when executed by the CPU performing the steps of:
causing the voltage generating circuit to output a first analog voltage;
making the first switch conductive to cause the ADC to convert the first analog voltage into a first digital value;
storing the first digital value in the memory;
causing the DAC to output a second analog voltage in response to a digital input that is a digital code supplied via the bus;
making the second switch conductive to cause the ADC to convert the second analog voltage into a second digital value;
storing the second digital value in the memory;
calculating error of the ADC based on the first digital value; and
calculating error of the DAC based on the second digital value and the calculated error of the ADC.

5. The machine-readable medium as claimed in claim 4, wherein the program when executed by the CPU further performs a step of correcting a digital code output from the ADC based on the calculated error of the ADC when an analog voltage is input into the ADC from an external terminal connected to the analog input of the ADC.

6. The machine-readable medium as claimed in claim 4, wherein the program when executed by the CPU further performs a step of correcting a digital code input into the DAC based on the calculated error of the DAC when an analog voltage is to be output from the DAC to an external terminal connected to the analog output of the DAC.

7. A method of calculating error in a semiconductor integrated circuit including a bus, a CPU connected to the bus, a DAC having a digital input thereof connected to the bus, an ADC having a digital output thereof connected to the bus, a voltage generating circuit, a first switch configured to cause an electrical coupling between an analog input of the ADC and the voltage generating circuit to switch between a conductive state and a nonconductive state, and a second switch configured to cause an electrical coupling between an analog output of the DAC and the analog input of the ADC to switch between a conductive state and a nonconductive state, the method comprising the steps of:

causing the voltage generating circuit to output a first analog voltage;

making the first switch conductive to cause the ADC to convert the first analog voltage into a first digital value;

storing the first digital value in the memory;

causing the DAC to output a second analog voltage in response to a digital input that is a digital code supplied via the bus;

making the second switch conductive to cause the ADC to convert the second analog voltage into a second digital value;

storing the second digital value in the memory;

calculating error of the ADC based on the first digital value; and     calculating error of the DAC based on the second digital value and the calculated error of the ADC.

8. The method as claimed in claim 7, further comprising a step of correcting a digital code output from the ADC based on the calculated error of the ADC when an analog voltage is input into the ADC from an external terminal connected to the analog input of the ADC.

9. The method as claimed in claim 7, further comprising a step of correcting a digital code input into the DAC based on the calculated error of the DAC when an analog voltage is to be output from the DAC to an external terminal connected to the analog output of the DAC.

* * * * *